US006912333B2

(12) United States Patent
Mikawa et al.

(10) Patent No.: US 6,912,333 B2
(45) Date of Patent: Jun. 28, 2005

(54) OPTICAL INTERCONNECTION APPARATUS AND INTERCONNECTION MODULE

(75) Inventors: Takashi Mikawa, Musashino (JP); Tetsuzo Yoshimura, Machida (JP); Osamu Ibaragi, Shinjuku (JP)

(73) Assignee: Fujitsu Limited, Kawasaki (JP)

( * ) Notice: Subject to any disclaimer, the term of this patent is extended or adjusted under 35 U.S.C. 154(b) by 208 days.

(21) Appl. No.: 10/465,812

(22) Filed: Jun. 20, 2003

(65) Prior Publication Data

US 2004/0033008 A1 Feb. 19, 2004

(30) Foreign Application Priority Data

Jun. 21, 2002 (JP) ........................................ 2002-182142
Jun. 21, 2002 (JP) ........................................ 2002-182143

(51) Int. Cl.[7] ................................................ G02B 6/12
(52) U.S. Cl. .............................. 385/14; 385/88; 438/31
(58) Field of Search ........................ 385/10, 16, 49–50, 385/129, 39, 24, 42, 88, 147; 257/82, 85; 437/229, 234; 438/31, 107

(56) References Cited

U.S. PATENT DOCUMENTS

| | | | | |
|---|---|---|---|---|
| 5,244,818 | A | * | 9/1993 | Jokerst et al. ................. 438/25 |
| 5,280,184 | A | * | 1/1994 | Jokerst et al. ................. 257/82 |
| 6,343,171 | B1 | * | 1/2002 | Yoshimura et al. ........... 385/50 |
| 6,611,635 | B1 | * | 8/2003 | Yoshimura et al. ........... 385/14 |
| 6,684,007 | B2 | * | 1/2004 | Yoshimura et al. ........... 385/31 |
| 6,690,845 | B1 | * | 2/2004 | Yoshimura et al. ........... 385/14 |
| 6,706,546 | B2 | * | 3/2004 | Yoshimura et al. ........... 438/31 |
| 6,785,447 | B2 | * | 8/2004 | Yoshimura et al. ........... 385/42 |
| 6,815,249 | B2 | * | 11/2004 | Miura .......................... 438/65 |
| 6,815,869 | B2 | * | 11/2004 | Baba et al. ............. 310/313 R |
| 6,845,184 | B1 | * | 1/2005 | Yoshimura et al. ........... 385/14 |
| 2002/0028045 | A1 | * | 3/2002 | Yoshimura et al. ........... 385/50 |
| 2002/0039464 | A1 | * | 4/2002 | Yoshimura et al. ........... 385/14 |
| 2002/0097962 | A1 | * | 7/2002 | Yoshimura et al. ........... 385/50 |

FOREIGN PATENT DOCUMENTS

JP 2000-11458 1/2000
JP 2001-12724 1/2001

OTHER PUBLICATIONS

Camperi–Ginestet et al., "Alignable Epitaxial Liftoff of GaAs Materials with Selective Deposition Using Polyimide Diaphragms", IEEE Transactions Photonics Technology Letters, vol. 3, No. 12, Dec. 1991, pp 1123–1126.

* cited by examiner

Primary Examiner—Akm Enayet Ullah
(74) Attorney, Agent, or Firm—Staas & Halsey LLP

(57) ABSTRACT

For example, a surface emitting semiconductor laser and a driver IC are arranged three-dimensionally to put a submounting substrate between them, and LSIs such as a CPU, etc. are mounted on the driver IC. The surface emitting semiconductor laser is formed of the epitaxial lift-off (ELO) process and has a thickness of about 10 μm. A through hole is provided to all the submounting substrate, the surface emitting semiconductor laser, the driver IC, and the LSIs. These parts are connected electrically mutually via conductor in the through hole.

25 Claims, 17 Drawing Sheets

LASER

OPTICAL INTERCONNECTION APPARATUS AND INTERCONNECTION MODULE

CROSS-REFERENCE TO RELATED APLICATIONS

This application is based upon and claims priority of Japanese Patent Applications No.2002-182142 and No.2002-182143, filed in Jun. 21, 2002, the contents being incorporated herein by reference.

BACKGROUND OF THE INVENTION

1. Field of the Invention

The present invention relates to an optical interconnection apparatus installed into systems such as a computer such as a server, a client, etc. and a router, etc. to serve as an interface between an LSI such as CPU, a memory, etc. and an opto-electric hybrid substrate, and an interconnection module constituting the optical interconnection apparatus.

2. Description of the Prior Art

With the progress of the telecommunication technology and the information processing technology, the density of the electric wirings for connecting the electronic circuits in various systems such as the computer, the large-capacity switching system, etc. is increased higher. Such higher density acts as the main cause of an obstruction to larger scale and higher performance of the system. Also, the conspicuous progress of LSI in recent years brings about the higher density of input/output terminals of LSI and the higher density of the electric wirings provided in LSI, which act as the bottlenecks in performance improvement. In order to overcome such problems, the optical interconnection technology for optically connecting the electronic circuits mutually is watched with interest.

Normally, the optical interconnection apparatus is constructed by arranging two-dimensionally parts, that are the light emitting element such as the surface emitting semiconductor laser (VCSEL: Vertical Cavity Surface Emitting Laser) or the like, the driver IC for driving the light emitting element, the light receiving element such as the photodiode or the like, the receiver IC for driving the light receiving element, and the like (referred to as "interconnection modules" hereinafter), on the submounting substrate. In many cases, the LSI, in which a CPU circuit, a memory circuit, etc. are formed, as well as these interconnection modules is mounted on the submounting substrate.

However, the optical interconnection apparatus in the prior art has such a drawback that, since respective interconnection modules are arranged two-dimensionally, a packaging area become large and thus reduction in size is difficult. Also, there is such a problem that, since lengths of the electric wirings for connecting respective interconnection modules become longer, a high-speed operation is impeded and also an S/N ratio is deteriorated due to the crosstalk noise.

Also, the optical interconnection apparatus in which the silicon substrate is used as the submounting substrate, then the driver circuit, the receiver circuit, the CPU circuit, etc. are formed on the silicon substrate, and then the light emitting element and the light receiving element are mounted onto the silicon substrate has been developed. However, in the optical interconnection apparatus of this type, since the driver circuit, the receiver circuit, the CPU circuit, etc. are monolithically integrated, it is difficult to change the circuit and thus the versatility is low.

In order to miniaturize the optical interconnection apparatus, it may be considered that respective interconnection modules are arranged three-dimensionally (3D). For example, the optical element (the light emitting element or the light receiving element) is mounted under the submounting substrate and also the driver IC or the receiver IC is mounted on the submounting substrate. However, if the interconnection modules are arranged three-dimensionally, it is impossible to connect electrically respective interconnection modules.

Also, for example, the surface emitting semiconductor laser has electrodes on a surface on the light emitting side and a surface on the opposite side respectively. Therefore, the electrode provided to one surface side can be connected directly to the submounting substrate, but the electrode provided to the other surface side must be connected to the submounting substrate by the method such as the wire bonding, or the like. As a result, there is such a problem that the packaging step becomes complicated.

In addition, the optical interconnection apparatus in the prior art has such another drawback that, since the relatively expensive substrate such as the ceramic substrate, the silicon PLC (Planar Lightwave Circuit) substrate, or the like is used as the submounting substrate, a production cost is increased.

SUMMARY OF THE INVENTION

Therefore, it is an object of the present invention to provide an optical interconnection apparatus capable of further reducing a size, coping easily with changes of the circuit, and reducing a production cost, and an interconnection module constituting the optical interconnection apparatus.

An optical interconnection apparatus of the present invention comprises an optical element module formed of an epitaxial lift-off process (referred to as "ELO process" hereinafter); and an optical-element driving module for driving the optical element module; wherein both the optical element module and the optical-element driving module have a through hole that passes through from one surface to other surface, and are connected electrically via conductor in the through hole.

In the present invention, the through hole is provided to both the optical element module and the optical-element driving module. Then, the optical element module and the optical-element driving module are connected electrically to each other via the conductor in the through hole. Therefore, the optical element module and the optical-element driving module can be arranged three-dimensionally to drive. As a result, reduction in size of the optical interconnection apparatus can be attained much more.

Also, in the present invention, since respective modules are wired via the conductor in the through hole, lengths of the wirings can be shortened and the characteristics of the S/N ratio, or the like can be improved.

In addition, since the modules prepare every function, the optical interconnection apparatus can respond easily to changes of the circuit. Further, the normal printed-wiring board or the flexible substrate can be employed as the submounting substrate, or it is possible to select the situation that the submounting substrate should not be employed. Therefore, a production cost can be reduced rather than the prior art.

Furthermore, since the optical element module is formed by the ELO process, its thickness can be reduced extremely. For this reason, for example, when the optical-element driving module is jointed to the main substrate by the solder bumps, the optical element module can be mounted on a surface of the optical-element driving module on the main substrate side. As a result, an interval between the optical element module and the waveguide can be shortened extremely, and thus an optical coupling efficiency can be increased. Also, since the ELO process makes it possible to form the optical element module very small, a plurality of optical element modules can be mounted on one optical-element driving module and thus this optical interconnection apparatus can cope easily with WDM (Wavelength Division Multiplexing).

Another optical interconnection apparatus of the present invention comprises a main substrate; a submounting substrate arranged over the main substrate; a supporting member for supporting the submounting substrate; and an optical element module and an optical-element driving module mounted to put the submounting substrate therebetween, wherein all the submounting substrate, the optical element module, and the optical-element driving module have a through hole that passes through from one surface to other surface, and wirings of the submounting substrate and the optical element module and the optical-element driving module are connected electrically via conductor in the through hole.

The optical element module and the optical-element driving module may be stacked and mounted on one surface side of the submounting substrate. Also, the optical element module and the optical-element driving module may be mounted directly onto the main substrate without use of the submounting substrate.

In the present invention, the optical element module such as the surface emitting semiconductor laser, the photodiode, etc. and the optical-element driving module such as the driver IC, the receiver IC, etc. for driving the optical element are arranged three-dimensionally. Since the through hole is provided to both the optical element module and the optical-element driving module and then the optical element module and the optical-element driving module are connected electrically via the conductors in the through holes, these modules can be arranged three-dimensionally. As a result, the optical interconnection apparatus can be miniaturized. Also, since respective modules are connected electrically via the conductors in the through holes, lengths of the wirings can be shortened and thus the characteristics such as the S/N ratio, etc. can be improved.

Also, because respective functions are incorporated into individual modules, changes of the circuit can be easily handled. In addition, the normal printed-wiring board or the flexible substrate can be used as the submounting substrate, and thus the ceramic substrate, the silicon PLC substrate, etc. are not needed. Therefore, a production cost can be reduced rather than the prior art.

Also, an interconnection module of the present invention constituting an optical interconnection apparatus for connecting electronic circuits by a light, comprises a first electrode provided on a first surface; a second electrode provided on a second surface; a through hole that passes through from the first surface to the second surface; and a conductor formed in the through hole to connect electrically the first electrode and the second electrode.

In the present invention, the through hole is provided to the interconnection module and the first electrode on the first surface and the second electrode on the second surface are connected electrically via the conductors in the through holes. Therefore, when the interconnection modules are stacked, respective modules can be connected electrically via the conductors in the through holes. In other words, in the interconnection module of the present invention, respective modules are stacked and arranged, and the supply of the electric power and the inputting/outputting of the signals are carried out via the conductors in the through holes of respective modules. As a result, since the optical interconnection apparatus can be constructed by combining desired modules mutually, its versatility is high. Also, the lengths of the wirings between respective modules can be shortened, and the S/N ratio can be improved.

DESCRIPTION OF THE PREFERRED EMBODIMENTS

Embodiments of the present invention will be explained with reference to the accompanying drawings hereinafter.

(First Embodiment)

Figure 1:
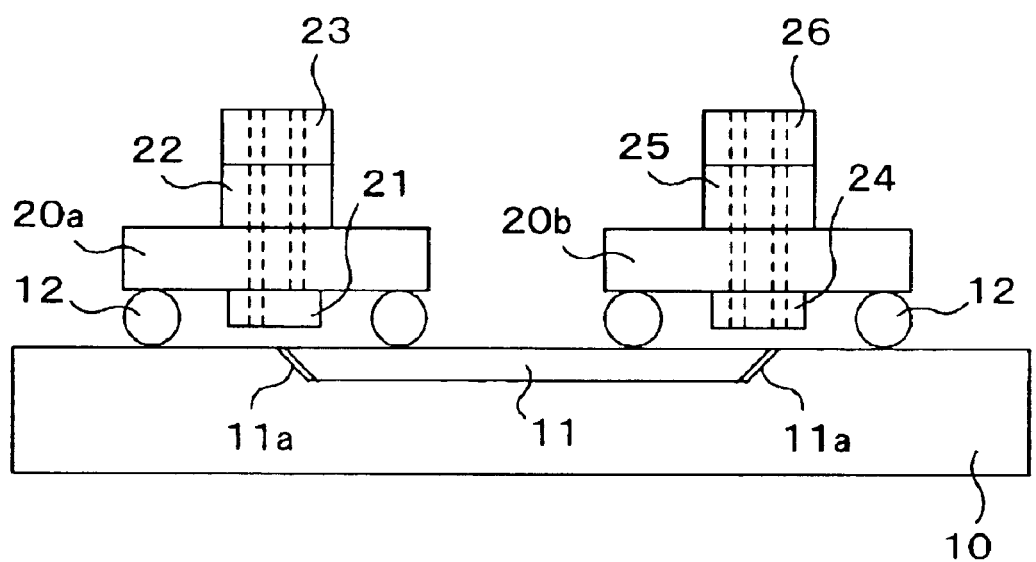
FIG. 1 is a schematic view showing an example of an optical interconnection apparatus of a first embodiment of the present invention.

FIG. 1 is a schematic view showing an example of an optical interconnection apparatus of a first embodiment of the present invention.

An optical waveguide 11 and an electric wiring (not shown) are formed on an opto-electric hybrid substrate (main substrate) 10 to have a predetermined pattern respectively. In the present embodiment, a substrate that is constructed by pasting a sheet-like optical waveguide made of polymer material onto a glass-epoxy printed-wiring board is used as the opto-electric hybrid substrate 10. However, in the present invention, the main substrate is not restricted to this.

A mirror 11a is provided to a predetermined position of the optical waveguide 11 so as to guide a light emitted from a surface emitting semiconductor laser 21, described later, to the optical waveguide 11 and to reflect a light that passes through the optical waveguide 11 toward a photodiode 24, described later.

Submounting substrates 20a, 20b are mounted on the opto-electric hybrid substrate 10 by solder bumps 12. In the present embodiment, the submounting substrates 20a, 20b are rigid substrates or flexible substrates that are formed of organic polymer, for example.

The surface emitting semiconductor laser 21, which is formed by ELO (Epitaxial Lift-Off) process to have a thickness of about 10 μm, is mounted under the submounting substrate 20a. The light emitted from the surface emitting semiconductor laser 21 is reflected by the mirror 11a and is guided into the optical waveguide 11.

Also, a driver IC 22 in which a circuit for driving the surface emitting semiconductor laser 21 is formed is mounted on the submounting substrate 20a. An LSI 23 in which a circuit such as CPU, a memory, or the like is formed is mounted on the driver IC 22.

An electrode is provided to an upper surface and a lower surface of all the submounting substrate 20a, the surface emitting semiconductor laser 21, the driver IC 22, and the LSI 23. Also, through holes (indicated by a broken line in FIG. 1) that pass through from the upper surface to the lower surface are provided to the submounting substrate 20a, the surface emitting semiconductor laser 21, the driver IC 22, and the LSI 23. The electrode provided on one surface side is connected electrically to a predetermined electrode of the electrodes provided on the other surface side via conductors in the through holes.

In other words, in the present embodiment, electrical connections between the surface emitting semiconductor laser 21, the driver IC 22 and the LSI 23 and between these parts and the submounting substrate 20a are executed via conductors in the through holes provided to respective parts and the submounting substrate 20a.

Also, electric wirings of the submounting substrate 20a are connected to electric wirings of the opto-electric hybrid substrate 10 via the solder bumps 12. Supply of the electric power to the surface emitting semiconductor laser 21, the driver IC 22, and the LSI 23 and inputting/outputting of electric signals are carried out via these electric wirings.

Similarly to this, the photodiode 24, which is formed by the ELO process to have a thickness of about 10 μm, is mounted under the submounting substrate 20b. A receiver IC 25 in which a circuit for driving the photodiode 24 is formed is mounted on the submounting substrate 20b. Also, an LSI 26 in which a circuit such as CPU, a memory, or the like is formed is mounted on the receiver IC 25.

An electrode is provided to an upper surface and a lower surface of all the submounting substrate 20b, the photodiode 24, the receiver IC 25, and the LSI 26. Also, through holes that pass through from the upper surface to the lower surface are provided to the submounting substrate 20b, the photodiode 24, the receiver IC 25, and the LSI 26. The electrode provided on one surface side is connected electrically to a predetermined electrode of the electrodes provided on the other surface side via conductors in the through holes.

Also, electric wirings of the submounting substrate 20b are connected to electric wirings of the opto-electric hybrid substrate 10 via the solder bumps 12. Supply of the electric power to the photodiode 24, the receiver IC 25, and the LSI 26 and inputting/outputting of electric signals are carried out via these electric wirings.

Figure 2:
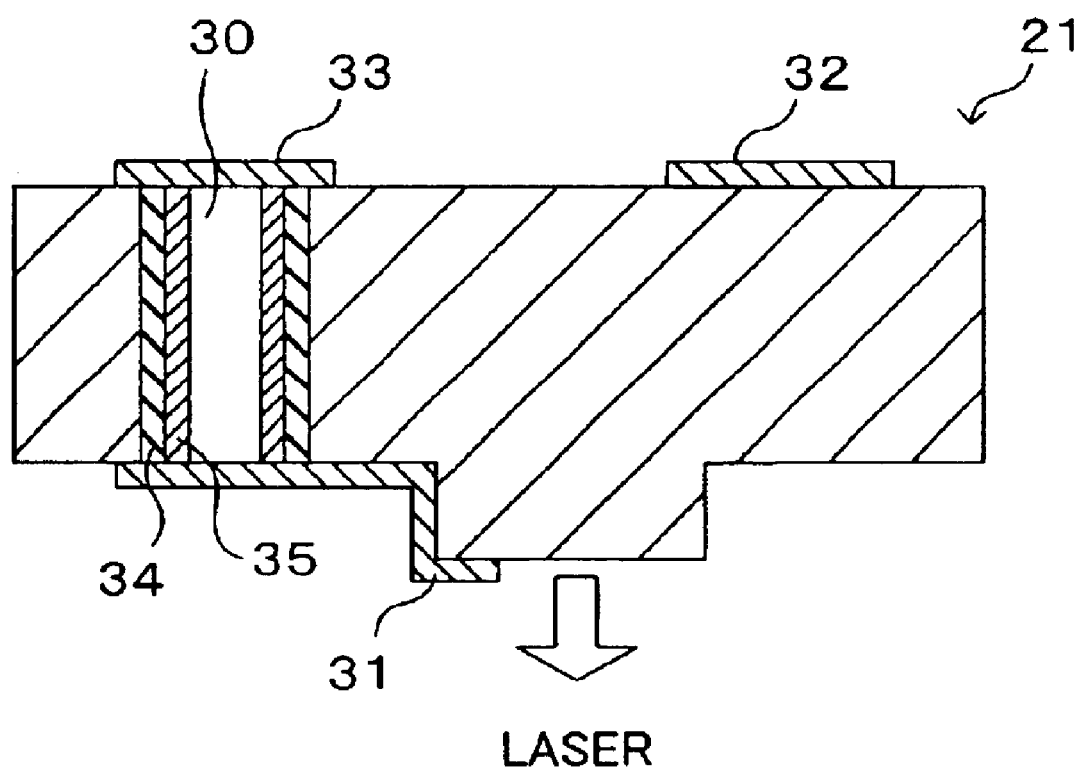
FIG. 2 is a schematic sectional view showing a surface emitting semiconductor laser employed in the first embodiment.

FIG. 2 is a schematic sectional view showing the surface emitting semiconductor laser 21. In the surface emitting semiconductor laser 21, an anode electrode 31 is provided onto a surface on the light emitting side, and a cathode electrode 32 is provided onto a surface on the back surface side. In the present embodiment, the anode electrode 31 provided onto the surface on the light emitting side is connected electrically to an electrode 33 provided on the back surface side via a conductive film 35 formed in a through hole 30.

The through hole 30 is formed by the reactive ion etching (RIE) method, for example. Then, an insulating film 34 is deposited/formed on a wall surface of the through hole 30 by the CVD method, or the like. Then, the conductive film 35 made of Pt (platinum), Au (gold) or the like is formed on the insulating film 34 by the sputter method, the CVD method, or the like.

Figure 3:
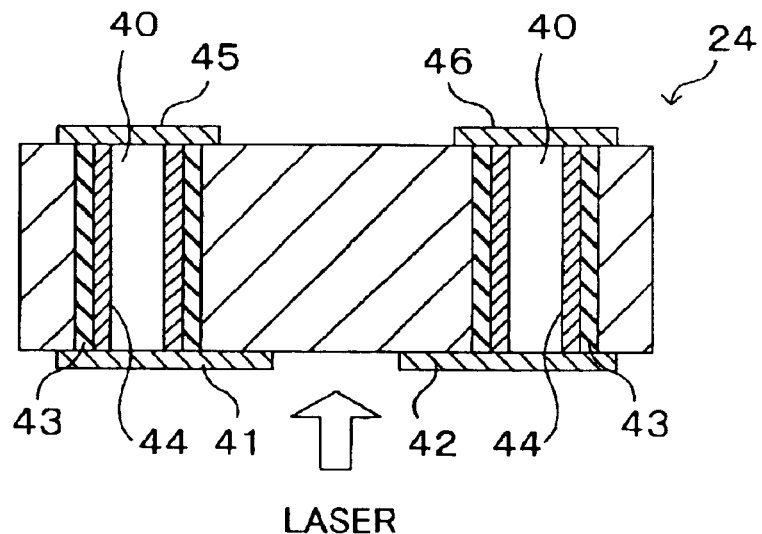
FIG. 3 is a schematic sectional view showing a photodiode employed in the first embodiment.

FIG. 3 is a schematic sectional view showing the photodiode 24. In the photodiode 24, an anode electrode 41 and a cathode electrode 42 are provided on the light receiving surface side. These electrodes 41, 42 are connected electrically to electrodes 45, 46 on the back surface side via a conductive film 44 in a through hole 40 respectively. In this case, an insulating film 43 is formed between a wall surface of the through hole 40 and the conductive film 44.

Figure 4:
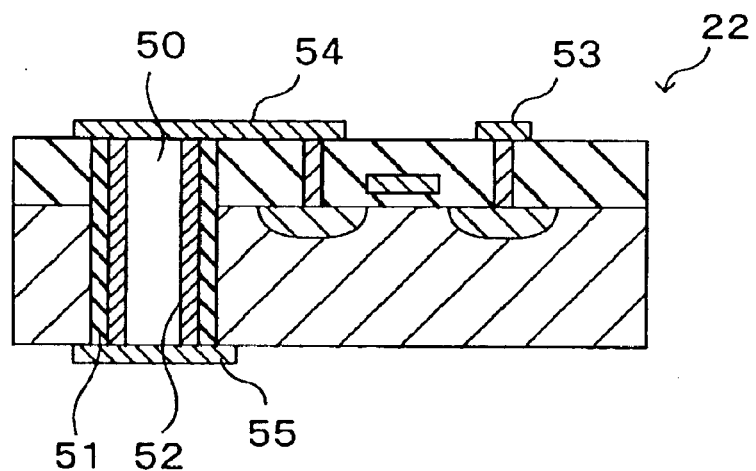
FIG. 4 is a schematic sectional view showing a driver IC employed in the first embodiment.

FIG. 4 is a schematic sectional view showing the driver IC 22. A through hole 50 that passes through from one surface to the other surface is also provided to the driver IC 22. This through hole 50 is formed by the reactive ion etching, for example. Then, an insulating film 51 and a conductive film 52 for covering an inner wall surface of the through hole 50 are formed sequentially. Then, an electrode 53 is formed on the one surface side and an electrode 55 is formed on the other surface side. In this case, though only one through hole is depicted in the driver IC 22 in FIG. 4, actually the required number of through holes to supply the electric power and transmit the signals is provided.

Like the driver IC 22, a plurality of through holes are provided to the receiver IC 25 and the LSIs 23, 26. Also, though insides of the through holes 30, 40, 50 are kept as hollow in FIG. 2 to FIG. 4, the conductor may be buried in the through hole after the insulating film is formed on the inner wall surface of the through hole.

In the present embodiment, the surface emitting semiconductor laser 21 and the photodiode 24 are formed by the ELO process and mounted on the submounting substrate 20a, 20b. Then, the ELO process will be explained hereunder (IEEE Photon Lett.,1991,3,(12).pp.1123–1126).

Figure 5A:
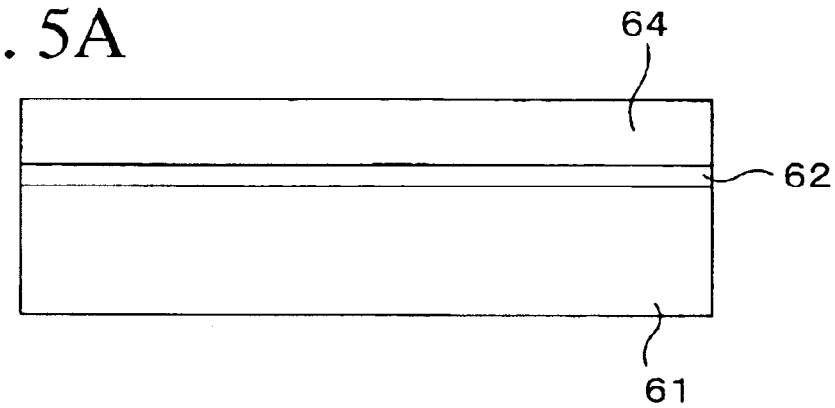
FIGS. 5A to 5G are schematic views showing an outline of the ELO process.

FIGS. 5A to 5G are schematic views showing an outline of the ELO process. First, as shown in FIG. 5A, an etching stopper layer 62 made of $Al_xGa_{1-x}As$ (where $0.3 \leq x \leq 1$), for example, is formed on a GaAs semiconductor substrate 61. Then, surface emitting semiconductor lasers (elements) 64 each having a GaAs/AlAs-based multi-layered structure are formed on the etching stopper layer 62 by using the molecular beam epitaxy method (MBE) or the metal organic chemical vapor deposition method (MOCVD). In this case, the structure for emitting a laser beam to the lower side of the substrate 61 is employed.

Figure 5B:
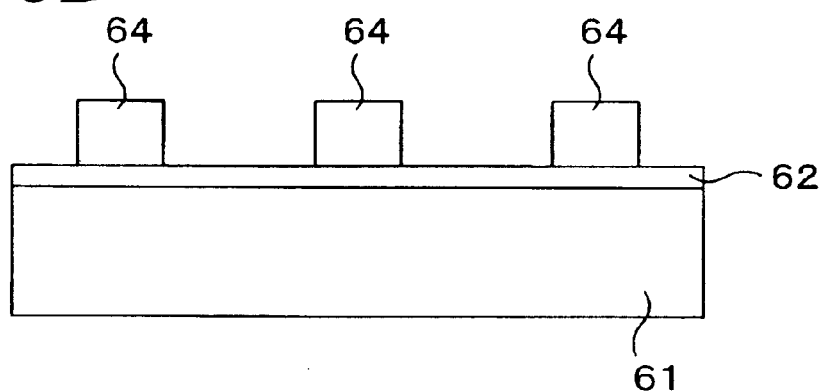

Then, as shown in FIG. 5B, respective elements 64 are separated by the reactive ion etching method. At this time, in the present embodiment, through holes that reach the etching stopper layer 62 from surfaces of the elements 64 are formed. Then, the insulating film and the conductive film for covering wall surfaces of the through holes are formed by the CVD method or the sputter method (see FIG. 2).

Figure 5C:
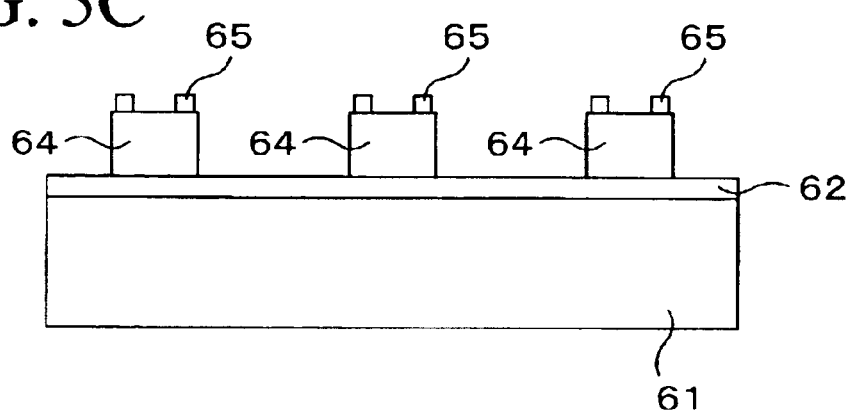

Then, as shown in FIG. 5C, predetermined electrodes 65 are formed on upper surfaces of the elements 64 respectively.

Figure 5D:
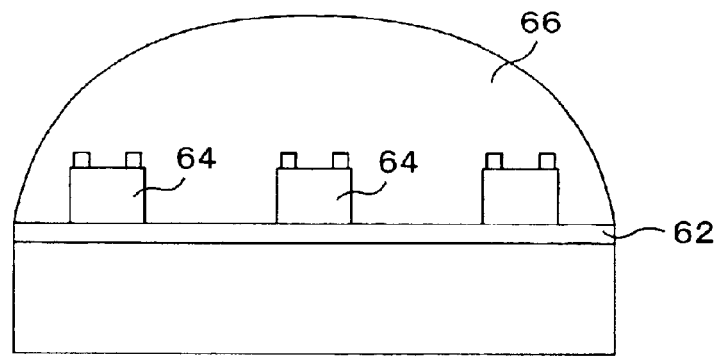
Figure 5E:
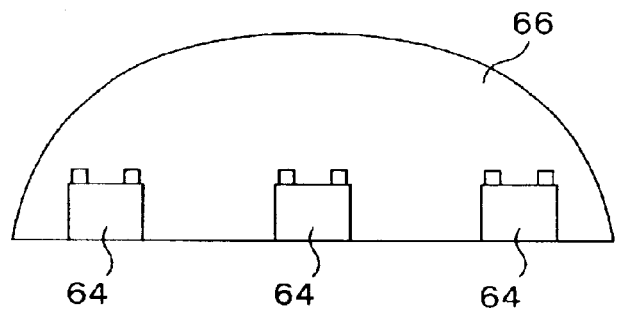

Then, as shown in FIG. 5D, the elements 64 are covered with a wax 66. Then, as shown in FIG. 5E, the semiconductor substrate 61 is etched from the back surface side to the etching stopper layer 62 by using a chlorine-based gas. Then, the etching stopper layer 62 is removed by continuing the reactive ion etching after the gas seed is exchanged. Then, electrodes are formed on the back surface side of the element 64.

Figure 5F:
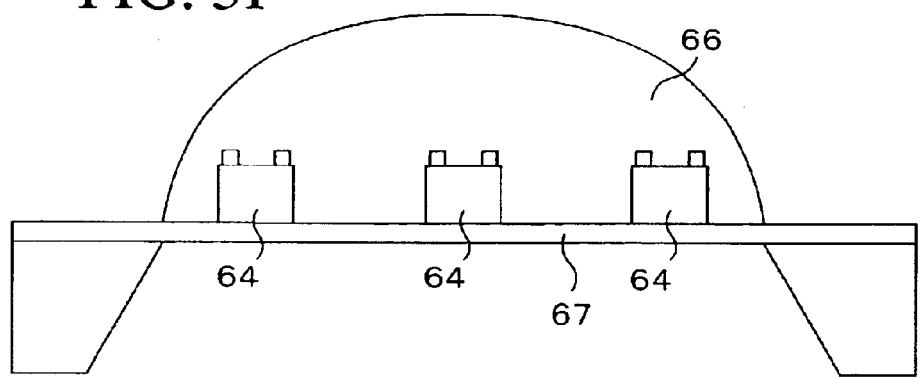

Then, as shown in FIG. 5F, the elements 64 are transferred onto a diaphragm 67 that is formed by employing the semiconductor, for example. Then, the wax 66 is removed.

Figure 5G:
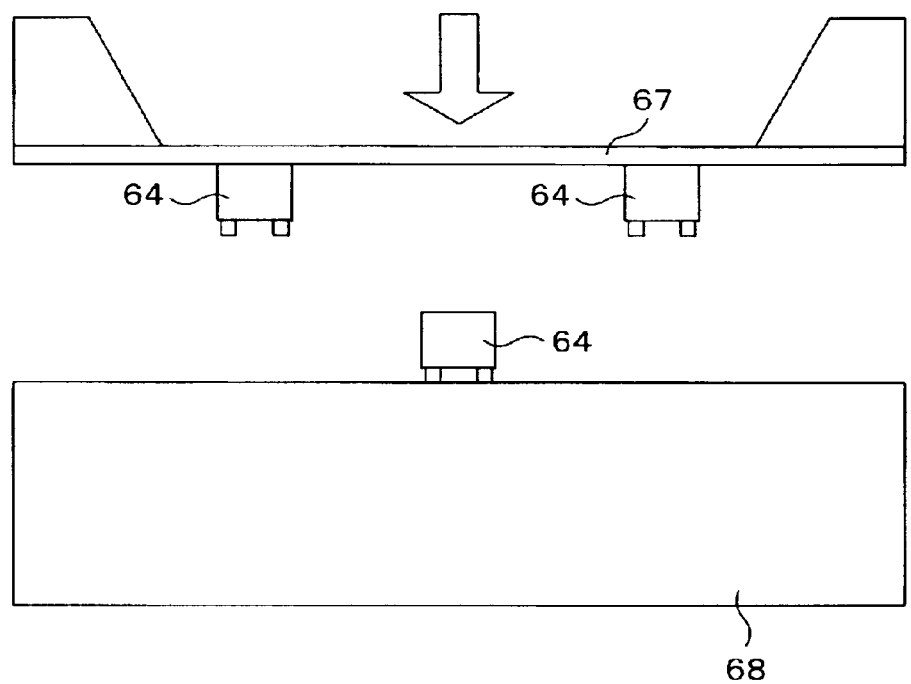

Then, as shown in FIG. 5G, the desired optical element 64 is pushed out by a pin from the back side of the diaphragm 67. Thus, the optical element 64 is mounted onto a submounting substrate 68.

The optical element formed by the ELO process in this manner has a thickness of about 10 μm, and can be thinned extremely rather than the normal optical element (whose thickness is about 100 μm) in the prior art.

In this case, in the above example, in the step in FIG. 5B, the elements 64 are constructed such that the light is emitted to the lower side of the substrate 61. In contrast, if the elements 64 are constructed such that the light is emitted to the upper side of the substrate 61, the direction of the elements 64 may be inverted by executing two times the waxing step.

In the present embodiment, all the surface emitting semiconductor laser 21, the submounting substrates 20a, 20b, the driver IC 22, the photodiode 24, the receiver IC 25, and the LSIs 23, 26 constituting the optical interconnection apparatus have the through hole, and then respective parts are connected electrically mutually via the conductor provided in the through hole. Therefore, respective parts can be arranged three-dimensionally and can be driven. As a result, the optical interconnection apparatus can be reduced in size rather than the prior art.

Also, in the present embodiment, the step of connecting the interconnection module and the submounting substrates 20a, 20b by means of the wire bonding, or the like can be omitted. Thus, assembling of the optical interconnection apparatus can be facilitated.

In addition, in the present embodiment, since respective parts are connected via the conductor provided in the through hole, a wiring length can be reduced. Thus, in contrast to the prior art, a higher-speed operation can be achieved and also characteristics such as the S/N ratio, etc. can be improved. Further, in the present embodiment, since respective functions are incorporated into individual modules, this embodiment can cope easily with changes of the circuit and also the reliability of the product can be improved.

Moreover, in the present embodiment, the ceramic substrate, the silicon PLC substrate, etc. can be omitted, and thus a production cost can be reduced.

Figure 6:
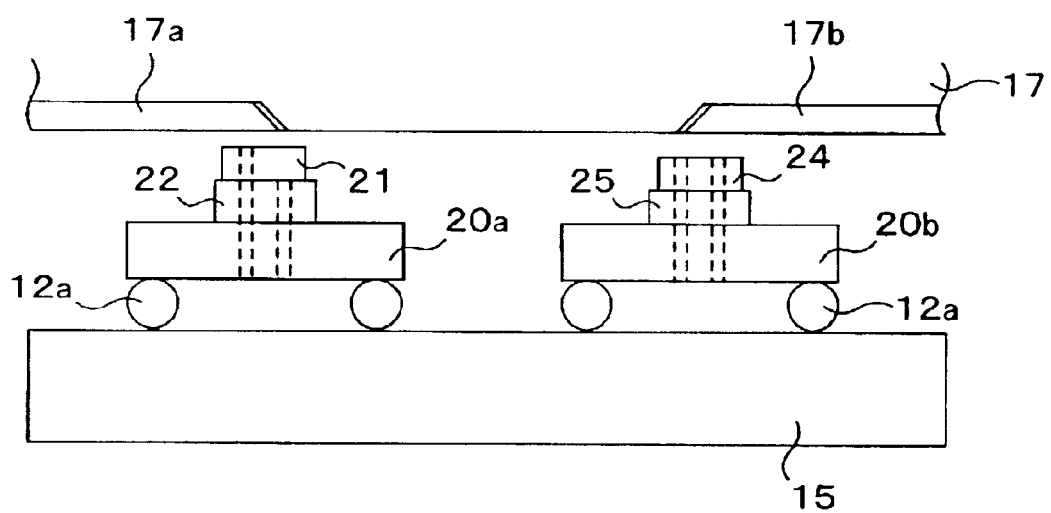
FIG. 6 is a schematic view showing another example of the first embodiment, wherein two interconnection modules are stacked and mounted on one surface sides of submounting substrates.

In this case, in the present embodiment, the case where the surface emitting semiconductor laser 21 and the driver IC 22 are arranged to put the submounting substrate 20a between them and also the photodiode 24 and the receiver IC 25 are arranged to put the submounting substrate 20b between them is explained. However, as shown in FIG. 6, the submounting substrate 20a, on which the driver IC 22 and the surface emitting semiconductor laser 21 are stacked/mounted, and the submounting substrate 20b, on which the receiver IC 25 and the photodiode 24 are stacked/mounted, may be mounted onto a substrate 15 on which electric wirings are formed. In this case, in the example shown in FIG. 6, a substrate 17 on which waveguides 17a, 17b are provided must be prepared separately from the substrate 15. Also, in the case of the optical interconnection system shown in FIG. 6, LSIs (not shown) such as the CPU, the memory, etc. are mounted on the substrate 15, and then are connected electrically to the driver IC 22 and the receiver IC 25 via solder bumps 12a.

(Second Embodiment)

Figure 7:
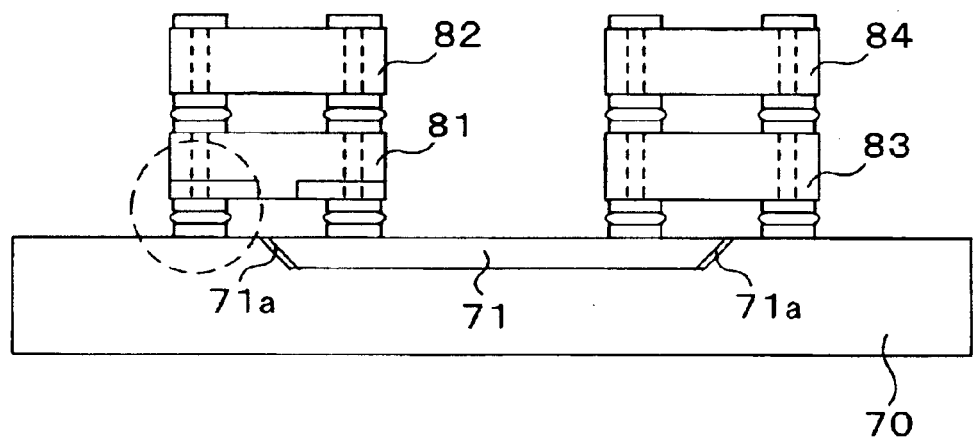
FIG. 7 is a schematic view showing an optical interconnection apparatus of a second embodiment of the present invention.
Figure 8:
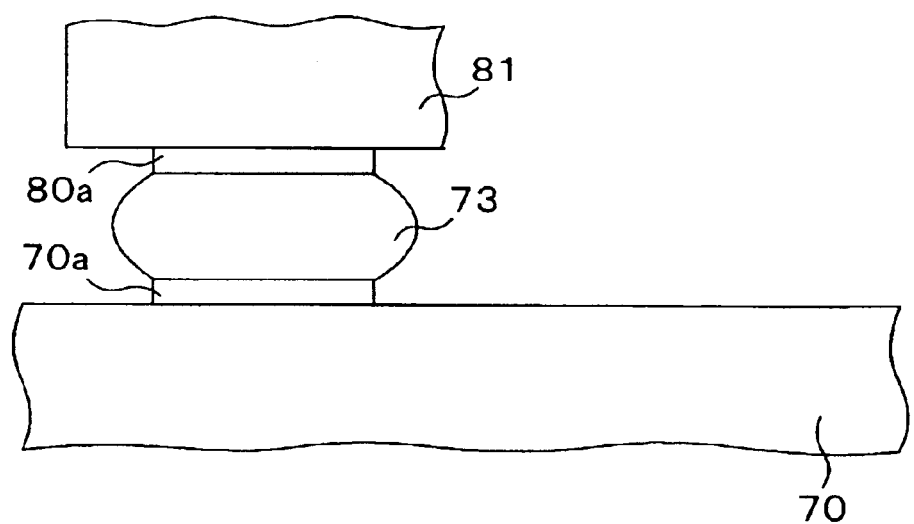
FIG. 8 is an enlarged view showing a portion indicated by a circle in FIG. 7.

FIG. 7 is a schematic view showing an optical interconnection apparatus of a second embodiment of the present invention. FIG. 8 is an enlarged view showing a portion indicated by a circle in FIG. 7.

An optical waveguide 71 and an electric wiring (not shown) are formed on an opto-electric hybrid substrate 70 to have a predetermined pattern respectively. A mirror 71a is provided at a predetermined position of the optical waveguide 71 to guide the light emitted from a surface emitting semiconductor laser 81 to the optical waveguide 71 and to reflect the light passing through the optical waveguide 71 toward a photodiode 83. In the present embodiment, the surface emitting semiconductor laser 81 and the photodiode 83 are formed by the ELO process.

In the present embodiment, the surface emitting semiconductor laser 81 and the photodiode 83 are jointed directly onto the opto-electric hybrid substrate 70 by the solder bumps. That is, as shown in FIG. 8, an electrode 70a for connecting the surface emitting semiconductor laser 81 and the photodiode 83 is provided to the opto-electric hybrid substrate 70, and then is connected to an electrode 80a, which is provided to the surface emitting semiconductor laser 81 and the photodiode 83, by a solder bump 73. In this case, it is preferable that, if a surface of the surface emitting semiconductor laser 81 on the light emitting side has a level difference, such level difference should be eliminated by polyimide, or the like.

A driver IC 82 is mounted on the surface emitting semiconductor laser 81, and then a receiver IC 84 is mounted on the photodiode 83. Through holes (indicated by a broken line in FIG. 7) are provided to all the surface emitting semiconductor laser 81, the driver IC 82, the photodiode 83, and the receiver IC 84. Electric wirings of the opto-electric hybrid substrate 70 and electrodes of the surface emitting semiconductor laser 81, the driver IC 82, the photodiode 83, and the receiver IC 84 are connected electrically via conductors provided in these through holes.

Here, in the present embodiment, LSIs (not shown) such as a CPU, a memory, etc. are mounted on the opto-electric hybrid substrate 70 and then are connected to the driver IC 82 and the receiver IC 84 via the electric wirings of the opto-electric hybrid substrate 70 and the through holes of the surface emitting semiconductor laser 81 and the photodiode 83 respectively.

Figure 9:
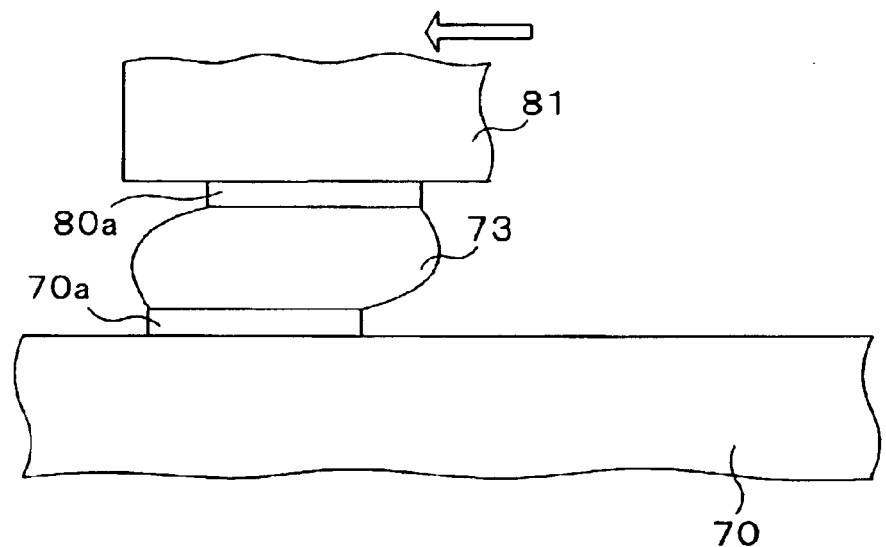
FIG. 9 is a schematic view showing the state that a position of the surface emitting semiconductor laser is adjusted automatically by a surface tension of a solder bump.

In the present embodiment, respective optical interconnection modules are arranged three-dimensionally on the opto-electric hybrid substrate 70 not to employ the sub-mounting substrate. Therefore, such an advantage can be achieved in contrast to the first embodiment that, since alignment between the optical waveguide 71 and the surface emitting semiconductor laser 81 and the photodiode 83 are attained in a self-alignment manner, the alignment step can be deleted. More particularly, as shown in FIG. 9, in the situation that the electrode 70a of the opto-electric hybrid substrate 70 and the electrode 80a of the surface emitting semiconductor laser 81 (or the photodiode 83) are jointed by the solder bumps 73, even if a position of the surface emitting semiconductor laser 81 (or the photodiode 83) is slightly displaced with respect to the opto-electric hybrid substrate 70, the position of the surface emitting semiconductor laser 81 (or the photodiode 83) is corrected automatically into a predetermined position by a surface tension of the solder bump 73. As a result, the step of adjusting the alignment between the surface emitting semiconductor laser 81 and the photodiode 83 and the optical waveguide is not needed, and thus a production cost can be reduced.

Also, in the present embodiment, since the submounting substrate is not needed, further reduction in cost can be attained rather than the first embodiment.

In the present embodiment, the case where the LSIs such as the CPU, the memory, etc. are mounted on the opto-electric hybrid substrate 70 is explained. However, like the first embodiment, the LSIs in which the CPU, the memory, etc. are formed may be mounted on the driver IC 82 and the receiver IC 84.

(Third Embodiment)

Figure 10:
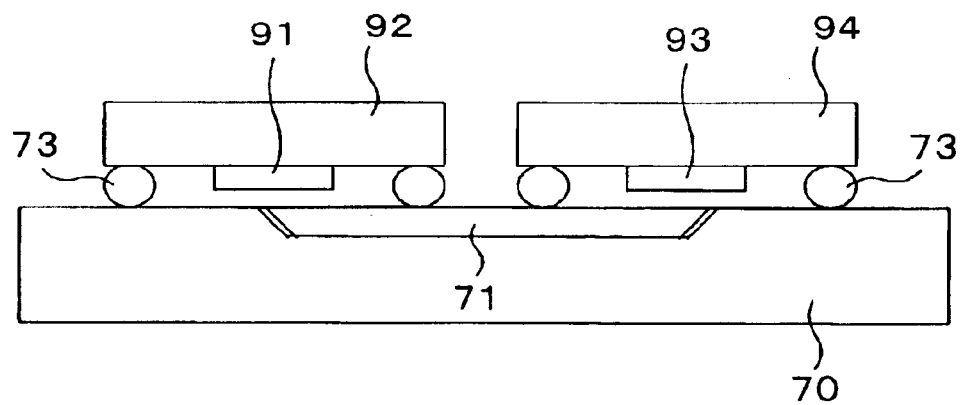
FIG. 10 is a schematic view showing a configuration of an optical interconnection apparatus of a third embodiment of the present invention.

FIG. 10 is a schematic view showing a configuration of an optical interconnection apparatus of a third embodiment of the present invention.

In the present embodiment, a driver IC 92 is jointed onto the opto-electric hybrid substrate 70 by the solder bumps 73. A surface emitting semiconductor laser 91, which is formed by the ELO process to have a thickness of about 10 μm, is mounted on the under surface side of this driver IC 92.

Similarly to this, a receiver IC 94 is jointed onto the opto-electric hybrid substrate 70 by the solder bumps 73. A photodiode 93, which is formed by the ELO process to have a thickness of about 10 μm, is mounted on the under surface side of this receiver IC 94.

An interval between the opto-electric hybrid substrate 70 and the driver IC 92 and the receiver IC 94 is set to about 30 μm, for example. The surface emitting semiconductor laser 91 and the photodiode 93 are placed at positions that are very close to the optical waveguide 71. According to the present embodiment, similar advantages to other embodiments can be achieved.

Figure 11:
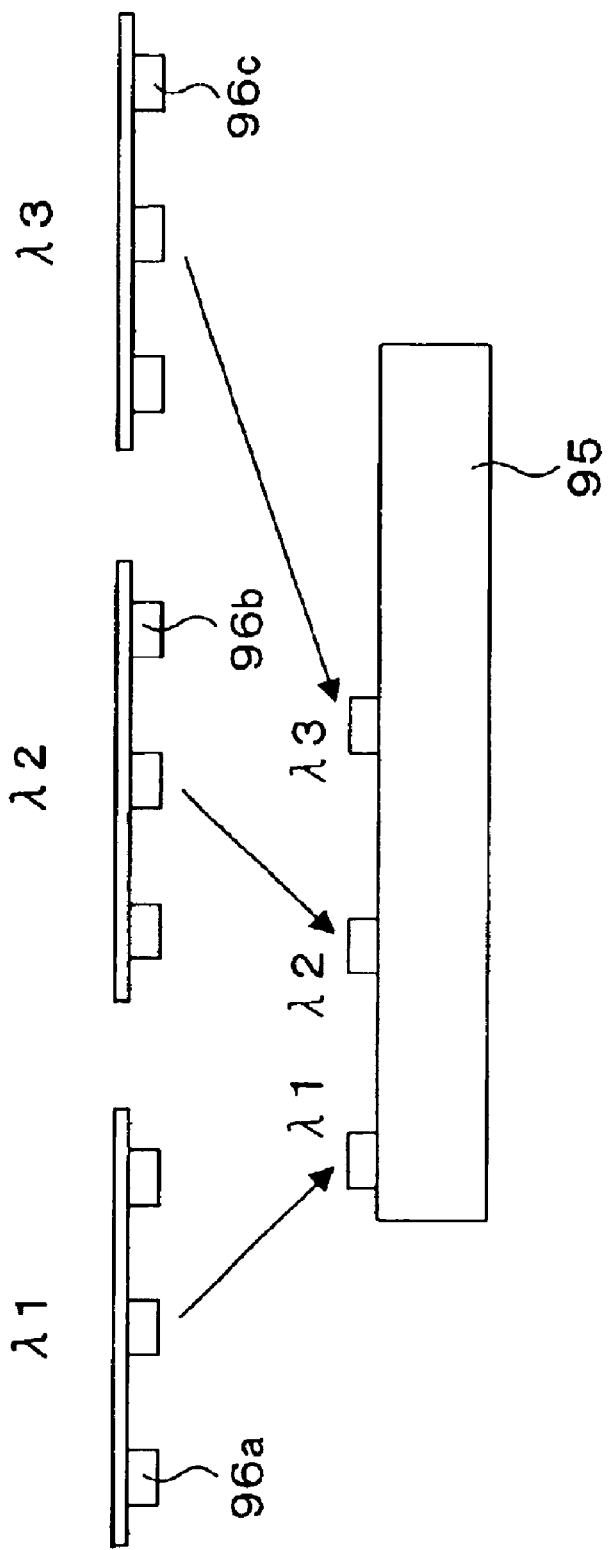
FIG. 11 is a schematic view showing an example in which a plurality of surface emitting semiconductor lasers, output lights of which have different wavelengths mutually, are mounted on one driver IC.

In this case, in the above embodiments, the case where one optical element module is mounted on one driver IC or one receiver IC is explained respectively. However, a plurality of optical element modules may be mounted on one driver IC or one receiver IC. For example, as shown in FIG. 11, a plurality of surface emitting semiconductor lasers 96a, 96b, 96c, wavelengths λ1, λ2, λ3 of output lights of which are different mutually, may be mounted on a driver IC 95. As a result, the present embodiment can cope easily with the WDM.

(Fourth Embodiment)

Figure 12:
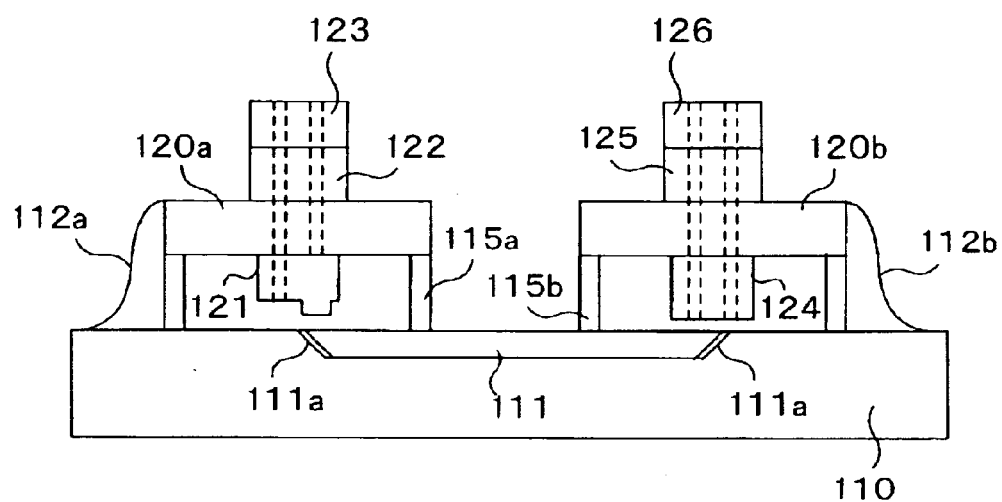
FIG. 12 is a schematic view showing an example of an optical interconnection apparatus of a fourth embodiment of the present invention.

FIG. 12 is a schematic view showing an example of an optical interconnection apparatus of a fourth embodiment of the present invention.

An optical waveguide 111 and an electric wiring (not shown) are formed on an opto-electric hybrid substrate (main substrate) 110 to have a predetermined pattern respectively. In the present embodiment, a substrate obtained by pasting a sheet-like optical waveguide made of polymer material onto a printed-wiring board is used as the opto-electric hybrid substrate 110. In this case, in the present invention, a structure of the main substrate is not restricted to this.

A mirror 111a is provided at a predetermined position so as to guide the light emitted from a surface emitting semiconductor laser 121, described later, to the optical waveguide 111 and to reflect the light passing through the optical waveguide 111 toward a photodiode 124, described later.

Supporting members 115a, 115b are arranged on the opto-electric hybrid substrate 110, and submounting substrates 120a, 120b are supported by the supporting members 115a, 115b and arranged over the opto-electric hybrid substrate 110. In the present embodiment, the submounting substrates 120a, 120b are a rigid substrate made of organic polymer, for example, respectively. Electric wirings (pattern wirings) are formed on these submounting substrates 120a, 120b. These wirings are connected to electric wirings on the opto-electric hybrid substrate 110 via flexible substrates 112a, 112b.

The surface emitting semiconductor laser 121 is mounted under the submounting substrate 120a. The light emitted from the surface emitting semiconductor laser 121 is reflected by the mirror 111a and then is guided toward the inside of the optical waveguide 111.

Also, a driver IC 122 in which a circuit for driving the surface emitting semiconductor laser 121 is formed is mounted on the submounting substrate 120a. An LSI 123 in which a circuit such as a CPU, a memory, or the like is formed is mounted on the driver IC 122.

An electrode is provided on an upper surface and a lower surface of all the submounting substrate 120a, the surface emitting semiconductor laser 121, the driver IC 122, and the LSI 123 respectively. Also, through holes (indicated by a broken line in FIG. 12), that are formed to pass through from the upper surface to the lower surface, are provided to the submounting substrate 120a, the surface emitting semiconductor laser 121, the driver IC 122, and the LSI 123. The electrode provided onto one surface side is connected electrically to a predetermined electrode out of electrodes provided onto the other surface side via conductors in the through holes. Then, the electrode of the submounting substrate 120a and electrodes of the surface emitting semiconductor laser 121 and the driver IC 122, and the electrode of the driver IC 122 and the electrode of the LSI 123 are connected mutually by the solder bumps (not shown) respectively.

In other words, in the present embodiment, electric connections between the surface emitting semiconductor laser 121, the driver IC 122, and the LSI 123 and electric connections between these parts and the submounting substrate 120a are implemented via conductors in the through holes provided to respective parts and the submounting substrate 120a.

Also, electric wirings of the submounting substrate 120a are connected to electric wirings of the opto-electric hybrid substrate 110 via the flexible substrate 112a. The supply of the electric power to the surface emitting semiconductor laser 121, the driver IC 122, and the LSI 123 and the inputting/outputting of electric signals are carried out via these electric wirings.

Similarly to this, the photodiode 124 is mounted under the submounting substrate 120b. A receiver IC 125 in which a circuit for driving the photodiode 124 is formed is mounted on the submounting substrate 120b. Also, an LSI 126 in which a circuit such as a CPU, a memory, or the like is formed is mounted on the receiver IC 125.

An electrode is provided to an upper surface and a lower surface of all the submounting substrate 120b, the photodiode 124, the receiver IC 125, and the LSI 126. Also, through holes that are formed to pass through from the upper surface to the lower surface are provided to the submounting substrate 120b, the photodiode 124, the receiver IC 125, and the LSI 126. The electrode provided on one surface side is connected electrically to a predetermined electrode out of the electrodes provided on the other surface side via conductors in the through holes. Then, the electrode of the submounting substrate 120b and electrodes of the photodiode 124 and the receiver IC 125, and the electrode of the receiver IC 125 and the electrode of the LSI 126 are connected mutually by solder bumps (not shown).

Also, electric wirings of the submounting substrate 120b are connected to electric wirings of the opto-electric hybrid substrate 110 via the flexible substrate 112b. The supply of the electric power to the photodiode 124, the receiver IC 125, and the LSI 126 and the inputting/outputting of electric signals are carried out via these electric wirings.

Figure 13:
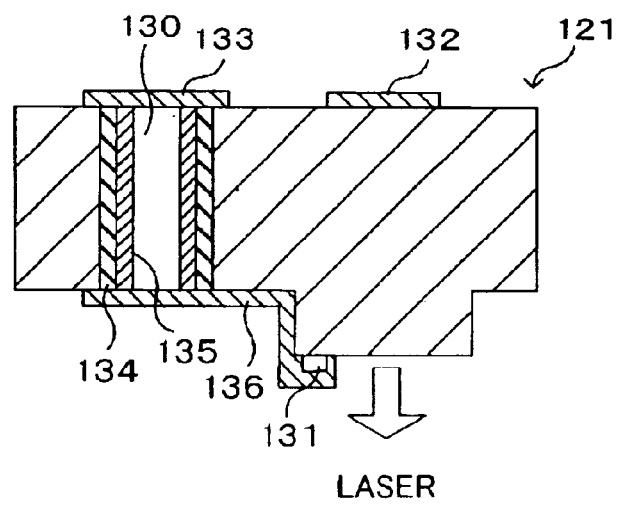
FIG. 13 is a schematic sectional view showing a surface emitting semiconductor laser employed in the fourth embodiment.

FIG. 13 is a schematic sectional view showing the surface emitting semiconductor laser 121. In the surface emitting semiconductor laser 121, an anode electrode 131 is provided on a surface on the light emitting side and a cathode electrode 132 is provided on the back surface side. In the present embodiment, the anode electrode 131 provided on the surface on the light emitting side is connected electrically to an electrode 133 on the back surface side via a leading electrode 136 and a conductive film 135 in a through hole 130.

The through hole 130 is formed by the reactive ion etching (RIE) method, for example. Then, an insulating film 134 made of SiO$_2$, SiN, or the like is deposited/formed on a wall surface of the through hole 130 by the sputter method, the CVD method, or the like. Then, the conductive film 135 made of Pt (platinum), Au (gold), or the like is formed on the insulating film 134 by the sputter method, the CVD method, or the like. Then, the electrode 133 that is connected electrically to the conductive film 135 in the through hole 130 is formed on the same surface side as the cathode electrode 132. Also, the leading electrode 136 that connects electrically the anode electrode 131 and the conductive film 135 is formed on a surface on the anode electrode 131 side.

Figure 14:
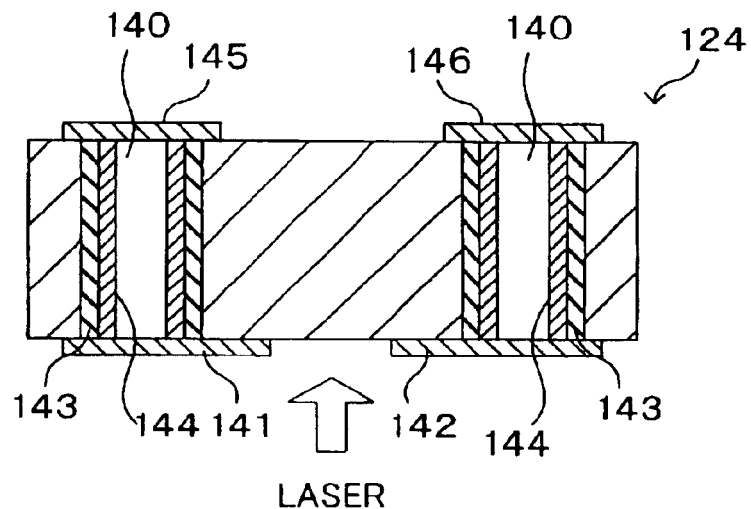
FIG. 14 is a schematic sectional view showing a photodiode employed in the fourth embodiment.

FIG. 14 is a schematic sectional view showing the photodiode 124. In the photodiode 124, an anode electrode 141 and a cathode electrode 142 are provided on the light receiving surface side. These electrodes 141, 142 are connected electrically to electrodes 145, 146 provided on the back surface side via a conductive film 144 in a through hole 140 respectively. In this case, an insulating film 143 is formed between a wall surface of the through hole 140 and the conductive film 144.

Figure 15:
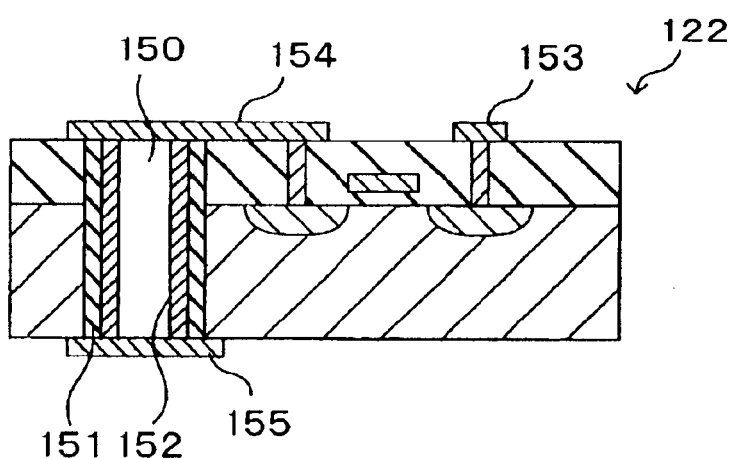
FIG. 15 is a schematic sectional view showing a driver IC employed in the fourth embodiment.

FIG. 15 is a schematic sectional view showing the driver IC 122. A through hole 150 that passes through from one surface to the other surface is also provided to the driver IC 122. This through hole 150 is formed by the reactive ion etching, for example. Then, an insulating film 151 and a conductive film 152 for covering an inner wall surface of the through hole 150 are formed sequentially. Then, an electrode 153 is formed on the one surface side and an electrode 155 is formed on the other surface side. In this case, though only one through hole is depicted in the driver IC 122 in FIG. 15, actually the required number of through holes to supply the electric power and transmit the signals is provided.

Like the driver IC 122, a plurality of through holes are provided to the receiver IC 125 and the LSIs 123, 126. Also, though insides of the through holes 130, 140, 150 are kept as hollow in FIG. 13 to FIG. 15, the conductor may be buried in the through hole after the insulating film is formed on the inner wall surface of the through hole.

In the present embodiment, all the surface emitting semiconductor laser 121, the submounting substrates 120a, 120b, the driver IC 122, the photodiode 124, the receiver IC 125, and the LSIs 123, 126 constituting the optical interconnection apparatus have the through hole, and then respective parts are connected electrically mutually via the conductor provided in the through hole. Therefore, respective parts can be arranged three-dimensionally and can be driven. As a result, the optical interconnection apparatus can be integrated more highly than the prior art.

Also, in the present embodiment, the step of connecting the interconnection module and the submounting substrates 120a, 120b by virtue of the wire bonding, or the like can be omitted. Thus, the assembling of the optical interconnection apparatus can be facilitated.

In addition, in the present embodiment, since lengths of the wirings for connecting respective modules can be reduced, the higher-speed operation can be achieved and also the characteristics such as the S/N ratio, etc. can be improved. Further, in the present embodiment, since respective functions are incorporated into individual modules, this embodiment can cope easily with changes of the circuit and also the reliability of the product can be improved.

In this case, in the present embodiment, the case where the submounting substrates 120a, 120b are connected electrically to the opto-electric hybrid substrate 110 via the flexible substrates 112a, 112b is explained. But the present invention is not restricted to this. For example, leads for connecting electrically the submounting substrates 120a, 120b and the opto-electric hybrid substrate 110 may be provided to the supporting members 115a, 115b.

Also, the electric power may be supplied to the driver IC 122, the receiver IC 125, and the LSIs 123, 126 via the leads provided to the supporting members 115a, 115b. Also, inputting/outputting of the signals may be executed via the flexible substrates.

Figure 16:
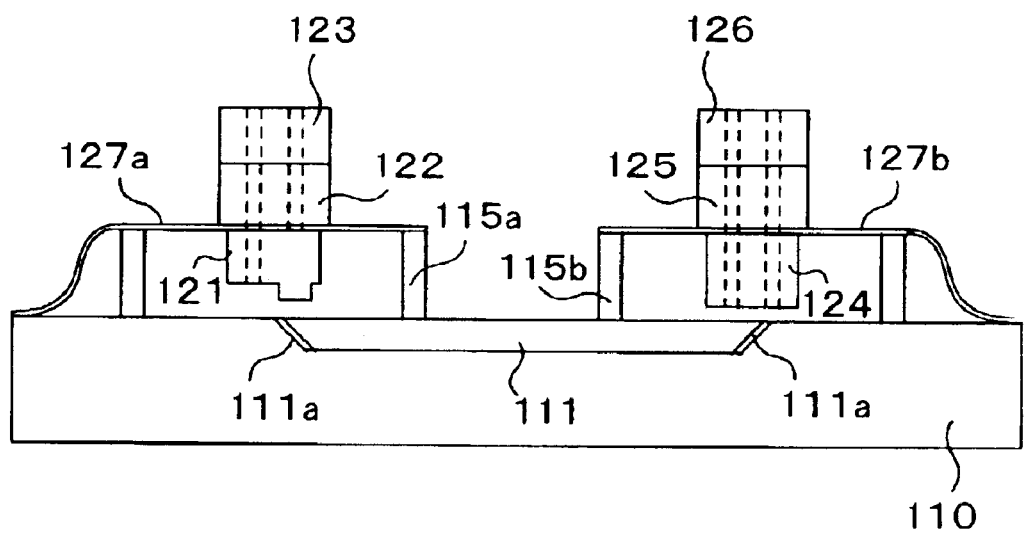
FIG. 16 is a schematic view showing another example of the fourth embodiment, wherein flexible substrates in which through holes are provided are employed as the submounting substrates.

Further, in the present embodiment, the case where rigid substrates formed of organic polymer are employed as the submounting substrates 120a, 120b is explained. However, as shown in FIG. 16, flexible substrates 127a, 127b in which through holes are provided may be employed as the submounting substrates. In this case, the electric wirings of the submounting substrates can be connected directly to the electric wirings of the opto-electric hybrid substrate 110. As a result, the structure can be simplified much more and also further reduction in cost can be achieved.

Figure 17:
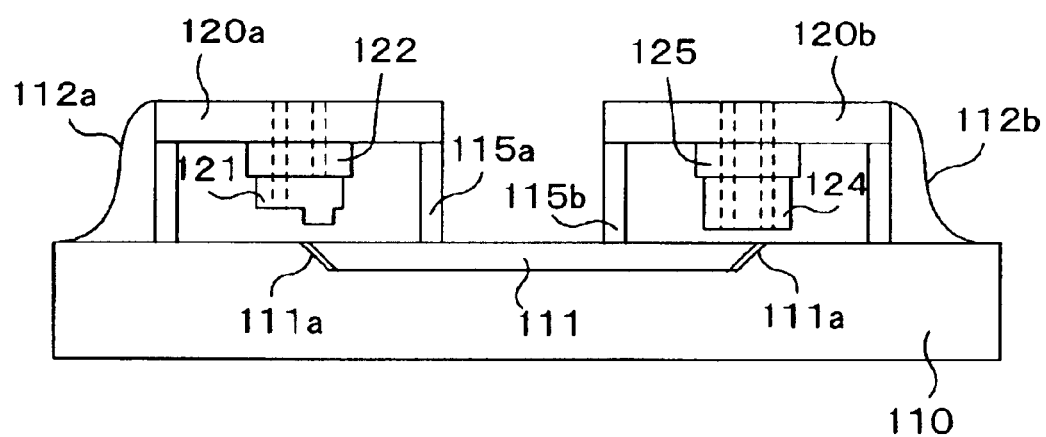
FIG. 17 is a schematic view showing still another example of the fourth embodiment, wherein two interconnection modules are stacked and mounted on one surface sides of the submounting substrates.

Moreover, in the above embodiment, the case where the surface emitting semiconductor laser 121 and the driver IC 122 are arranged to put the submounting substrate 120a between them and also the photodiode 124 and the receiver IC 125 are arranged to put the submounting substrate 120b between them is explained. However, as shown in FIG. 17, the surface emitting semiconductor laser 121 and the driver IC 122 as well as the photodiode 124 and the receiver IC 125 may be arranged on one surface side of the submounting substrates 120a, 120b. In the case of the optical interconnection apparatus shown in FIG. 17, the LSIs (not shown) such as the CPU, the memory, etc. are mounted on the opto-electric hybrid substrate 110, and are connected electrically to the driver IC 122 and the receiver IC 125 via the flexible substrates 112a, 112b.

(Fifth Embodiment)

Figure 18:
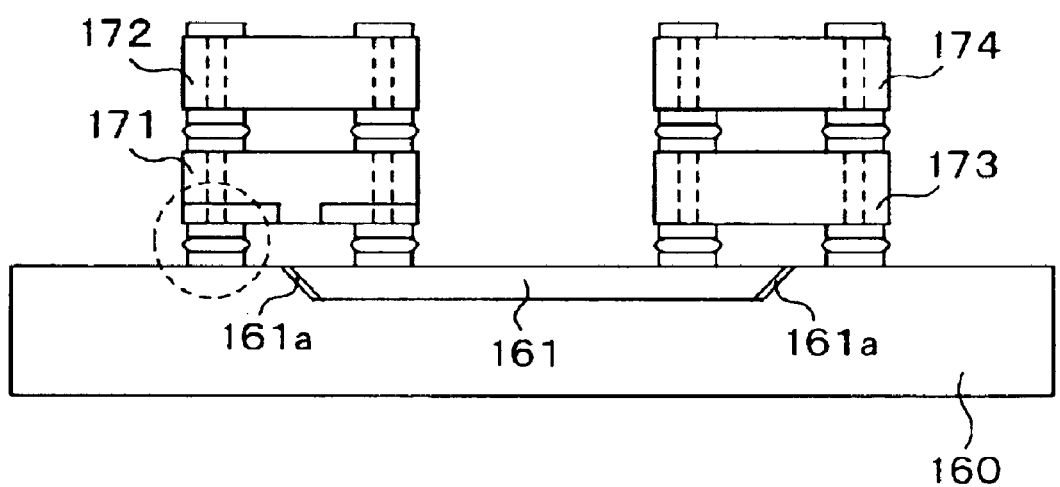
FIG. 18 is a schematic view showing an optical interconnection apparatus of a fifth embodiment of the present invention.
Figure 19:
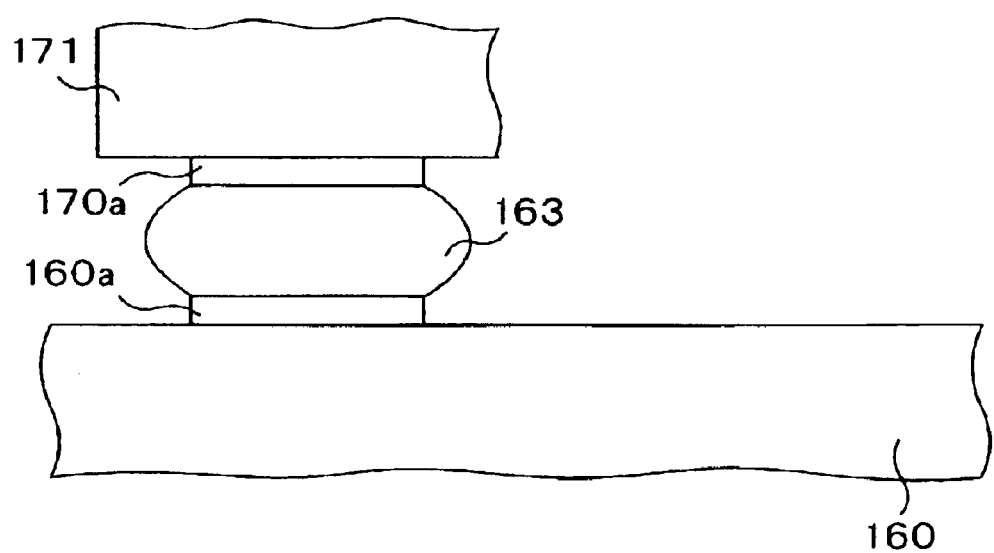
FIG. 19 is an enlarged view showing a portion indicated by a circle in FIG. 18.

FIG. 18 is a schematic view showing an optical interconnection apparatus of a fifth embodiment of the present invention. FIG. 19 is an enlarged view showing a portion indicated by a circle in FIG. 18.

An optical waveguide 161 and an electric wiring (not shown) are formed on an opto-electric hybrid substrate 160 to have a predetermined pattern respectively. A mirror 161a is provided at a predetermined position of the optical waveguide 161 to guide the light emitted from a surface emitting semiconductor laser 171 to the optical waveguide 161 and to reflect the light passing through the optical waveguide 161 toward a photodiode 173.

In the present embodiment, the surface emitting semiconductor laser 171 and the photodiode 173 are mounted directly onto the opto-electric hybrid substrate 160 by the solder bumps. That is, as shown in FIG. 19, an electrode 160a for connecting the surface emitting semiconductor laser 171 and the photodiode 173 is provided to the opto-electric hybrid substrate 160, and then is connected to an electrode 170a, which is provided to the surface emitting semiconductor laser 171 and the photodiode 173, by a solder bump 163. In this case, it is preferable that, if a surface of the surface emitting semiconductor laser 171 on the light emitting side has a level difference, such level difference should be eliminated by polyimide, or the like.

A driver IC 172 is mounted on the surface emitting semiconductor laser 171, and then a receiver IC 174 is mounted on the photodiode 173. Through holes (indicated by a broken line in FIG. 18) are provided to all the surface emitting semiconductor laser 171, the driver IC 172, the photodiode 173, and the receiver IC 174. Electric wirings of the opto-electric hybrid substrate 160 are connected electrically to electrodes of the surface emitting semiconductor laser 171, the driver IC 172, the photodiode 173, and the receiver IC 174 via conductors provided in these through holes.

In this case, in the present embodiment, the LSIs (not shown) such as the CPU, the memory, etc. are mounted on the opto-electric hybrid substrate 160 and then are connected to the driver IC 172 and the receiver IC 174 via the electric wirings of the opto-electric hybrid substrate 160 and the through holes of the surface emitting semiconductor laser 171 and the photodiode 173 respectively.

Figure 20:
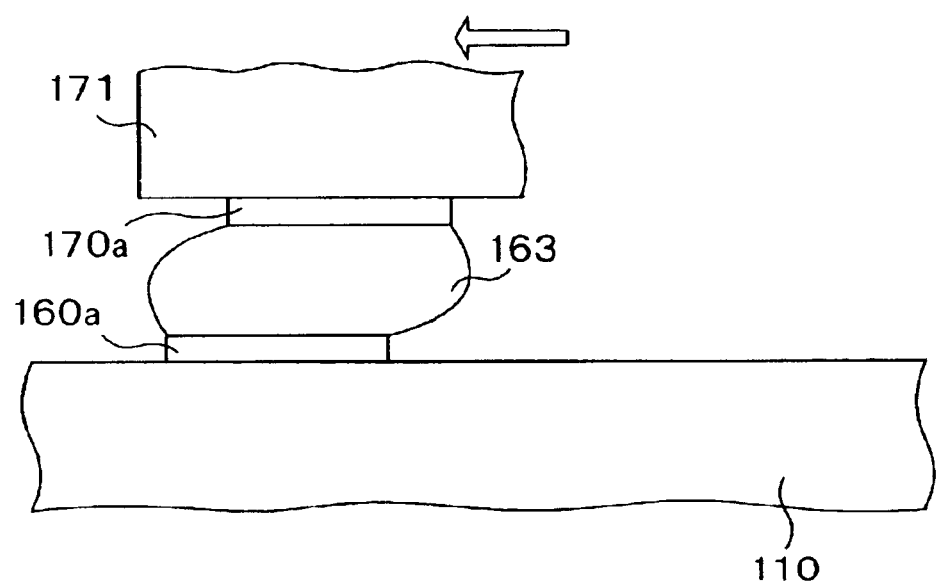
FIG. 20 is a schematic view showing the state that the position of the surface emitting semiconductor laser is adjusted automatically by the surface tension of the solder bumps.

In the present embodiment, respective optical interconnection modules are arranged three-dimensionally on the opto-electric hybrid substrate 160 without use of the sub-mounting substrate. Therefore, such an advantage can be achieved in contrast to the fourth embodiment that, since alignment between the optical waveguide and the surface emitting semiconductor laser 171 and the photodiode 173 is executed in a self-alignment manner, the alignment step can be deleted. More particularly, as shown in FIG. 20, in the situation that the electrode 160a of the opto-electric hybrid substrate 160 and the electrode 170a of the surface emitting semiconductor laser 171 (or the photodiode 173) are jointed by the solder bumps 163, even if a position of the surface emitting semiconductor laser 171 (or the photodiode 173) is slightly displaced with respect to the opto-electric hybrid substrate 160, the position of the surface emitting semiconductor laser 171 (or the photodiode 173) is corrected automatically into a predetermined position by a surface tension of the solder bump 163. As a result, the step of adjusting the alignment between the surface emitting semiconductor laser 171 and the photodiode 173 and the optical waveguide is not needed, and thus a production cost can be reduced.

Also, in the present embodiment, since the submounting substrate and the flexible substrate are not needed, further reduction in cost can be attained rather than the fourth embodiment.

In the present embodiment, the case where the LSIs such as the CPU, the memory, etc. are mounted on the opto-electric hybrid substrate 160 and are connected electrically via the wirings on the opto-electric hybrid substrate 160 and the through holes provided in the surface emitting semiconductor laser 171 and the photodiode 173 is explained. However, like the fourth embodiment, the LSIs in which the CPU, the memory, etc. are formed may be mounted on the surface emitting semiconductor laser 171 and the receiver IC 174.

What is claimed is:

1. An optical interconnection apparatus comprising:
   an optical element module formed of an epitaxial lift-off process; and
   an optical-element driving module for driving the optical element module;
   wherein both the optical element module and the optical-element driving module have a through hole that passes through from one surface to other surface, and are connected electrically via conductor in the through hole.

2. An optical interconnection apparatus comprising:
   a main substrate;
   a submounting substrate mounted on the main substrate;
   an optical element module formed of an epitaxial lift-off process and mounted on one surface side of the submounting substrate; and
   an optical-element driving module mounted on other surface side of the submounting substrate;
   wherein all the submounting substrate, the optical element module, and the optical-element driving module have a through hole that passes through from one surface to other surface, and wirings of the submounting substrate and the optical element module and the optical-element driving module are connected electrically via conductor in the through hole.

3. An optical interconnection apparatus comprising:
   a main substrate;
   a submounting substrate mounted on the main substrate;
   an optical-element driving module mounted on one surface side of the submounting substrate; and
   an optical element module formed of an epitaxial lift-off process and mounted on the optical-element driving module;

wherein both the optical element module and the optical-element driving module have a through hole that passes through from one surface to other surface, and wirings of the submounting substrate and the optical element module and the optical-element driving module are connected electrically via conductor in the through hole.

4. An optical interconnection apparatus according to claim 2, wherein the submounting substrate is mounted onto the main substrate by solder bumps.

5. An optical interconnection apparatus comprising:
a main substrate;
an optical-element driving module mounted on the main substrate; and
an optical element module formed of an epitaxial lift-off process and mounted on the optical-element driving module;
wherein the optical element module and the optical-element driving module have a first electrode provided on a first surface, a second electrode provided on a second surface, a through hole that passes through from the first surface to the second surface, and a conductor formed in the through hole to connect electrically the first electrode and the second electrode respectively.

6. An optical interconnection apparatus according to claim 5, wherein the optical-element driving module is connected to the main substrate by solder bumps.

7. An optical interconnection apparatus comprising:
a main substrate;
an optical element module formed of an epitaxial lift-off process and mounted on the main substrate; and
an optical-element driving module mounted on the optical element module;
wherein the optical element module and the optical-element driving module have a first electrode provided on a first surface, a second electrode provided on a second surface, a through hole that passes through from the first surface to the second surface, and a conductor formed in the through hole to connect electrically the first electrode and the second electrode respectively.

8. An optical interconnection apparatus according to claim 7, wherein the optical element module is connected to the main substrate by solder bumps.

9. An optical interconnection apparatus according to claim 1, wherein a plurality of optical element modules are provided to respond to one optical-element driving module.

10. An optical interconnection apparatus comprising:
a main substrate;
a submounting substrate arranged over the main substrate;
a supporting member for supporting the submounting substrate; and
an optical element module and an optical-element driving module mounted to put the submounting substrate therebetween;
wherein all the submounting substrate, the optical element module, and the optical-element driving module have a through hole that passes through from one surface to other surface, and wirings of the submounting substrate and the optical element module and the optical-element driving module are connected electrically via conductor in the through hole.

11. An optical interconnection apparatus comprising:
a main substrate;
a submounting substrate arranged over the main substrate;
a supporting member for supporting the submounting substrate; and
an optical element module and an optical-element driving module stacked and mounted on one surface side of the submounting substrate;
wherein both the optical element module and the optical-element driving module have a through hole that passes through from one surface to other surface, and wirings of the submounting substrate and the optical element module and the optical-element driving module are connected electrically via conductor in the through hole.

12. An optical interconnection apparatus according to claim 10, wherein electric wirings of the submounting substrate and electric wirings of the main substrate are connected via a flexible substrate.

13. An optical interconnection apparatus according to claim 10, wherein the submounting substrate is formed of a flexible substrate.

14. An optical interconnection apparatus comprising:
a main substrate;
an optical element module and an optical-element driving module stacked and mounted on the main substrate;
wherein the optical element module and the optical-element driving module have a first electrode provided on a first surface, a second electrode provided on a second surface, a through hole that passes through from the first surface to the second surface, and a conductor formed in the through hole to connect electrically the first electrode and the second electrode respectively, and respective modules are jointed by solder bumps.

15. An interconnection module constituting an optical interconnection apparatus for connecting electronic circuits by a light, comprising:
a first electrode provided on a first surface;
a second electrode provided on a second surface;
a through hole that passes through from the first surface to the second surface; and
a conductor formed in the through hole to connect electrically the first electrode and the second electrode.

16. An optical interconnection apparatus according to claim 3, wherein the submounting substrate is mounted onto the main substrate by solder bumps.

17. An optical interconnection apparatus according to claim 2, wherein a plurality of optical element modules are provided to respond to one optical-element driving module.

18. An optical interconnection apparatus according to claim 3, wherein a plurality of optical element modules are provided to respond to one optical-element driving module.

19. An optical interconnection apparatus according to claim 4, wherein a plurality of optical element modules are provided to respond to one optical-element driving module.

20. An optical interconnection apparatus according to claim 5, wherein a plurality of optical element modules are provided to respond to one optical-element driving module.

21. An optical interconnection apparatus according to claim 6, wherein a plurality of optical element modules are provided to respond to one optical-element driving module.

22. An optical interconnection apparatus according to claim 7, wherein a plurality of optical element modules are provided to respond to one optical-element driving module.

23. An optical interconnection apparatus according to claim 8, wherein a plurality of optical element modules are provided to respond to one optical-element driving module.

24. An optical interconnection apparatus according to claim 11, wherein electric wirings of the submounting substrate and electric wirings of the main substrate are connected via a flexible substrate.

25. An optical interconnection apparatus according to claim 11, wherein the submounting substrate is formed of a flexible substrate.

* * * * *